(12) United States Patent
Hwang et al.

(10) Patent No.: US 7,498,223 B2
(45) Date of Patent: Mar. 3, 2009

(54) SEMICONDUCTOR DEVICES HAVING IMPROVED FIELD PLATES

(75) Inventors: Kiuchul Hwang, Amherst, NH (US); Elsa K. Tong, Wayland, MA (US)

(73) Assignee: Raytheon Company, Waltham, MA (US)

( * ) Notice: Subject to any disclaimer, the term of this patent is extended or adjusted under 35 U.S.C. 154(b) by 173 days.

(21) Appl. No.: 11/693,762

(22) Filed: Mar. 30, 2007

(65) Prior Publication Data
US 2007/0166888 A1    Jul. 19, 2007

Related U.S. Application Data

(62) Division of application No. 11/096,512, filed on Apr. 1, 2005, now abandoned.

(51) Int. Cl.
| H01L 21/336 | (2006.01) |
| H01L 21/3205 | (2006.01) |
| H01L 21/4763 | (2006.01) |
| H01L 21/311 | (2006.01) |

(52) U.S. Cl. .................. 438/261; 438/585; 438/706; 438/258

(58) Field of Classification Search ............... 438/261, 438/135, 142, 736, 717, 706, 258, 582, 570, 438/572, 591, 585
See application file for complete search history.

(56) References Cited

U.S. PATENT DOCUMENTS

| 4,288,806 | A |   | 9/1981  | Ronen |
| 4,694,565 | A | * | 9/1987  | Custode ............. 438/217 |
| 5,104,825 | A |   | 4/1992  | Takikawa |
| 5,559,049 | A |   | 9/1996  | Cho |
| 5,578,512 | A |   | 11/1996 | Tao |
| 5,686,741 | A |   | 11/1997 | Ohori et al. |
| 5,721,164 | A | * | 2/1998  | Wu ...................... 438/159 |
| 6,274,893 | B1 |  | 8/2001  | Igarashi et al. |

(Continued)

FOREIGN PATENT DOCUMENTS

DE    198 27 901 A1    1/1999

(Continued)

OTHER PUBLICATIONS

PCT/US2006/004788 International Search Report dated Oct. 6, 2006.

(Continued)

*Primary Examiner*—Chuong Anh Luu
(74) *Attorney, Agent, or Firm*—Daly, Crowley, Mofford & Durkee, LLP

(57) ABSTRACT

A field effect transistor device and method, such device having source and drain electrodes in ohmic contact a semiconductor. A gate electrode-field plate structure is disposed between the source and drain electrodes. The gate electrode-field plate structure comprises: a dielectric; a first metal in Schottky contact the semiconductor; and a second metal. The second metal has: a first portion disposed over and electrically connected to a portion of the first metal; and a second portion, separated from a second portion of the first metal by a portion of the dielectric and extending beyond an edge of the first metal to an edge of the second metal. The edge of the first metal is further from the drain electrode than the edge of the second metal to provide a field-plate for the field effect transistor.

1 Claim, 3 Drawing Sheets

U.S. PATENT DOCUMENTS

| | | | |
|---|---|---|---|
| 6,670,652 | B2 | 12/2003 | Song |
| 7,169,697 | B2 * | 1/2007 | Seta et al. .................. 438/618 |
| 2002/0177261 | A1 | 11/2002 | Song |
| 2004/0188724 | A1 | 9/2004 | Ishida et al. |
| 2004/0227204 | A1 | 11/2004 | Hebert |
| 2005/0139868 | A1 | 6/2005 | Anda |

FOREIGN PATENT DOCUMENTS

| | | |
|---|---|---|
| EP | 1 261 035 A2 | 11/2002 |
| EP | 1 261 035 A3 | 11/2002 |
| EP | 1 478 013 A2 | 11/2004 |
| EP | 1 478 013 A3 | 11/2004 |
| WO | WO 98/49732 | 11/1998 |
| WO | WO 2005/029589 A1 | 3/2005 |

OTHER PUBLICATIONS

PCT/US2006/002040 International Search Report dated May 18, 2006.

PCT/US2005/017710 International Search Report dated Dec. 12, 2005.

*Ellen Lan et al., "A Field Plate Device by Self-Aligned Spacer Process", Motorola Inc., Microwave and Mixed Signal Technologies Lab, Tempe, AZ, 4 pgs.

* cited by examiner

SEMICONDUCTOR DEVICES HAVING IMPROVED FIELD PLATES

CROSS REFERENCE TO RELATED APPLICATIONS

This application is a Divisional Application of U.S. patent application Ser. No. 11/096,512 filed on Apr. 1, 2005, now abandoned which is hereby incorporated herein by reference in its entirety.

TECHNICAL FIELD

This invention relates generally to transistor devices and more particularly to transistor devices having field plates.

BACKGROUND

As is known in the art, wide bandgap semiconductors such as gallium nitride (GaN), aluminum gallium nitride (AlGaN), indium gallium nitride (InGaN), and silicon carbide (SiC) are very promising materials for high power RF/Microwave applications. As is also known in the art, in order to operate at high power, the device must be able to operate with high supply voltage. A limiting factor for high voltage operation is the breakdown voltage of the device. The field plate (FP) has been proposed and demonstrated to improve breakdown voltages for silicon power devices and GaAs FETs.

More particularly, a field plate is located between gate and drain electrodes but adjacent to the gate. The field plate extends the depletion edge from the gate-drain edge to the semiconductor region under the field plate and thereby shifts the peak electric field from the gate edge in the semiconductor to the field plate edge. This reduces the electric field at the gate-drain edge. Consequently, thermionic field emission current and tunneling current from the Schottky gate can be reduced significantly, resulting in a higher gate-drain breakdown voltage. In addition, surface trap effects can be suppressed dramatically, resulting in an increased available RF current at the open channel condition. With the improved off-state gate-drain breakdown voltage and on-state maximum RF channel current, field plate device can potentially operate at higher bias voltage with higher power density.

As is also known in the art, semiconductor substrates of gallium nitride (GaN), aluminum gallium arsenide (AlGaN), indium gallium nitride (InGaN), and silicon carbide (SiC) forming field effect transistors (FETs) are a new technology and the application of the field plate to those FETs has shown a severe degradation of the RF gain introduced by the feedback capacitance between gate and drain making them impractical desirable for high frequency applications. More particularly, field plates are typically formed by applying a dielectric, such as silicon nitride or silicon oxide, over the semiconductor; dry etching the dielectric to expose a portion of the surface of the semiconductor (typically using a plasma etch), and forming the gate-filed plate structure is in contact with the exposed portions of the semiconductor. It has been relatively difficult to process a field plate on a device with gate length less than 0.5 um for microwave frequency without damaging the substrate materials.

SUMMARY

In accordance with the present invention, a field effect transistor device is provided having source and drain electrodes in ohmic contact a semiconductor. A gate electrode-field plate structure is disposed between the source and drain electrodes. The gate electrode-field plate structure comprises: a dielectric; a first metal in Schottky contact the semiconductor; and a second metal. The second metal has: a first portion disposed over and electrically connected to a portion of the first metal; and a second portion, separated from a second portion of the first metal by a portion of the dielectric and extending beyond an edge of the first metal to an edge of the second metal. The edge of the first metal is further from the drain electrode than the edge of the second metal to provide a field-plate for the field effect transistor.

In accordance with another feature of the invention, a method is provided for forming a field effect transistor. The method includes forming source, drain, and gate metal contacts to a semiconductor. A dielectric layer is formed over the formed source, drain, and gate metal contacts. A first mask is formed over the dielectric layer. The first mask has a window therein disposed over a portion of the dielectric layer to expose an underlying portion of the dielectric layer. The exposed portion of the dielectric layer is disposed over a portion of the gate metal contact. A dry etch is applied to the first mask to remove portions of the dielectric layer exposed by the window to expose the portion of the gate metal contact with remaining portions of the dielectric being left over an edge region of the gate metal contact. The first mask is removed. A second mask is formed over the remaining portions of the dielectric layer. The second mask has a window therein disposed over portions of the gate metal contact and over the portions of the dielectric left over the edge region of the gate metal contact. A field plate metal is formed through the window in the second mask, such field plate: being electrically connected to the exposed portion of the gate metal contact; being separated the edge region of the gate metal contact by the portions of the dielectric left over the edge region; and, extending beyond the edge of the gate metal contact towards the drain metal contact.

With such an arrangement, the semiconductor surface is not exposed to plasma from the dry etch of the dielectric layer since the semiconductor surface is protected by the first metal.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
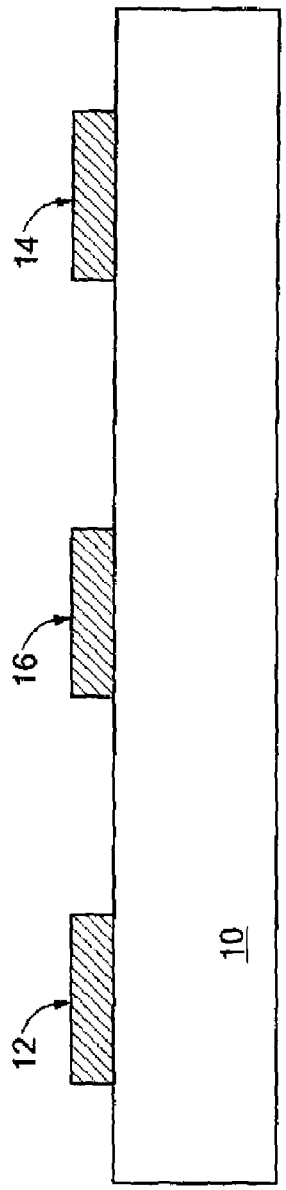
FIGS. 1-6 are cross sectional sketches of a semiconductor at various stages in the processing thereof in accordance with the invention.

Referring now to FIG. 1, a semiconductor 10, here a silicon carbide (SiC), aluminum gallium nitride (AlGaN) or gallium nitride (GaN), for example, is provided having source and drain electrodes 12, 14, respectively, in ohmic contact with the semiconductor 10 and a gate contact metal 16 in Schottky contact with the semiconductor 10. Here, the source and drain electrodes 12, 14 are metal contacts here made of titanium/aluminum/nickel/gold (Ti/Al/Ni/Au) metals. The gate contact metal 16 is here lower layer of nickel and a top layer of gold and is disposed between the source and drain electrodes 12, 14 as shown. Here, the total thickness of the gate metal contact 16 is 100 to 500 Angstroms.

Figure 2:
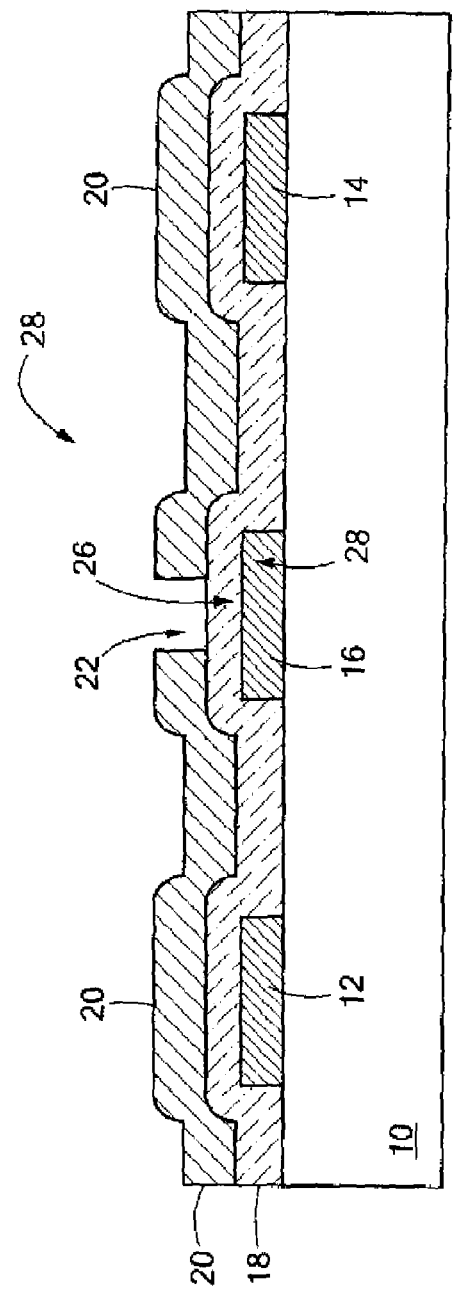

Referring now to FIG. 2, a layer 18 of dielectric for example, silicon nitride or silicon dioxide is formed over the structure, and thus over the formed source 12, drain 14, and gate metal contacts 16 shown in FIG. 1. Here, the dielectric layer 18 is silicon nitride deposited by plasma enhanced chemical vapor deposition (PECVD) to a thickness of here 500 Angstroms.

Next, a layer 20 of photoresist is formed over the dielectric layer 18, as shown. The photoresist layer 20 has a window 22 formed therein using either electron beam or conventional photolithography, to provide a mask 20. The window 22 exposes an underlying portion 26 of the dielectric layer 18, such portion 26 being disposed over a portion 28 of the gate metal contact 16.

Next, the mask 20 is exposed a dry etch, here a plasma etch having as an etchant $CF_4$ (carbon tetrafloruide) to remove portions 26 of the dielectric layer 18 exposed by the window 22 and to thereby expose the portion 28 of the gate metal contact 16.

Figure 3:
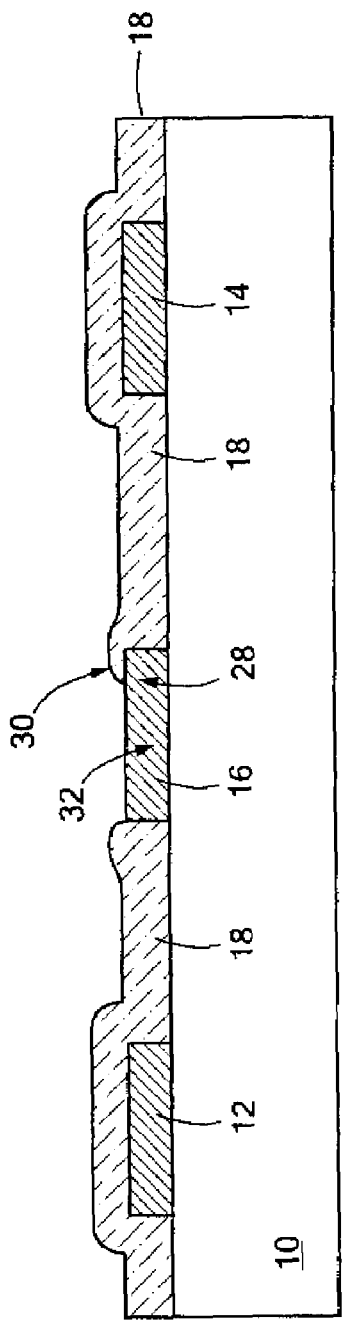

The mask 20 is removed leaving the structure shown in FIG. 3. It is noted that portions 30 of the dielectric layer 18 are left over edge regions 32 of the gate metal contact 16.

Figure 4:
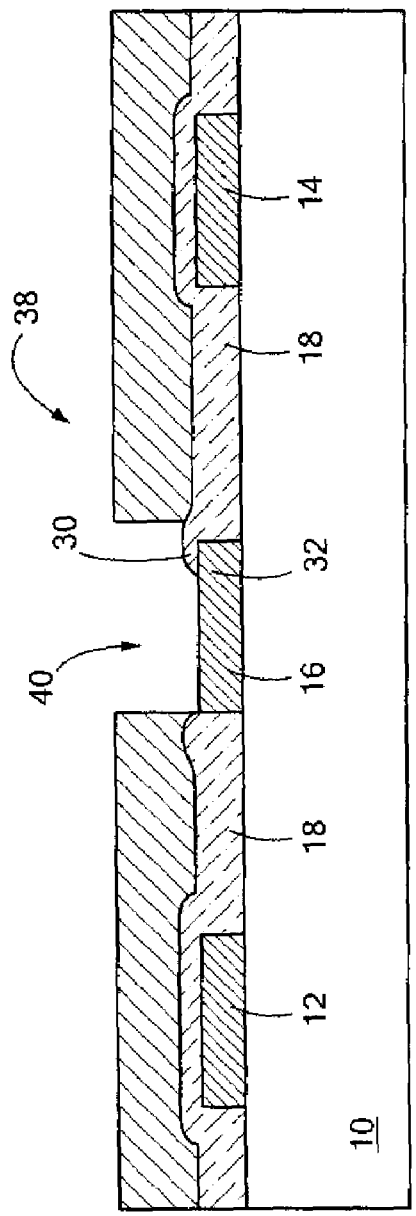

Next, referring now to FIG. 4, a second photoresist mask 38 is formed over the remaining portions of the dielectric layer 18. The second mask 38 has a window 40 therein disposed over portions of the gate metal contact 16 and over the portions 30 of the dielectric layer 18 left over the edge region 32 of the gate metal contact 16, as shown.

Figure 5:
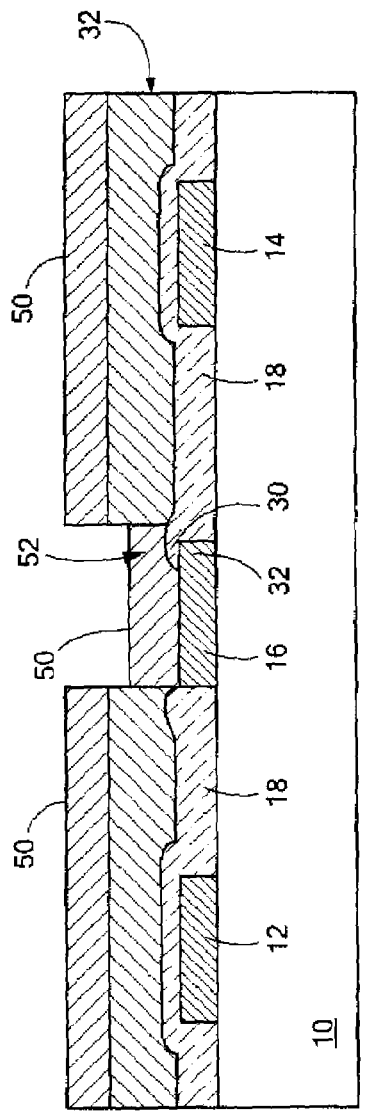
Figure 6:
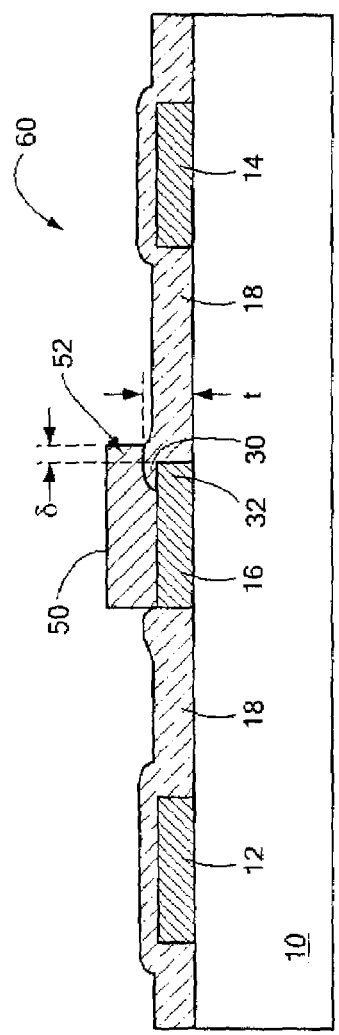

Next, referring now to FIG. 5, a conductive metal 50, here gold having a thickness of, for example, 3000 Angstroms, is deposited, here evaporated, over the mask 38 with portions of the conductive metal 50 being deposited on, and hence in electrical contact with, exposed portions of the gate contact metal 16 and also being deposited on the portions 30 of the dielectric layer 18 exposed by the window 40. Thus, a portion 52 of the metal layer 50 forms, after removal of the photoresist of mask 38, and hence removal of the portions of the metal 50 on the mask 38, a field plate 52 as shown in FIG. 6. It is noted that the field plate 52 is: electrically connected to the exposed portion of the gate metal contact 16; separated the edge region 32 of the gate metal contact 16 by the portions 30 of the dielectric layer 18 left over the edge region 32; and, extends beyond the edge region 32 of the gate metal contact 16 a distance δ towards the drain metal contact 14, as shown. It is also noted that the dielectric layer 18 has a thickness t between the field plate 52 and the semiconductor 10, as shown. The resulting field effect transistor 60 is shown in FIG. 6.

The process described above provides the field plate 52 without sacrificing RF gain at microwave frequency. The thickness of the dielectric, the length of the intrusion of the metal toward the drain side of the gate metal, the thickness of the gate metal before a dielectric deposition, and the etching of the dielectric may be optimized without damaging the surface of the semiconductor 10 before and after the formation of the gate metal contact 16.

Here, the gate length is less than 0.25 μm for frequencies higher than microwave because fmax (maximum unity gain frequency) and ft(unity current gain frequency) is inverse proportional to the gate length. In order to implement a field plate on a very thin dielectric such as less than 500 A, the initial, i.e., first, gate metal contact 16 thickness before the deposition of the thin dielectric layer has to be very thin. That way, the second metal, which is the actual field plate sitting on top of the dielectric, is working as an effective field plate without introducing any parasitics between the first and the second metal.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a field effect transistor, comprising:

forming source, drain, and gate metal contacts to a semiconductor;

forming a dielectric layer over the formed source, drain, and gate metal contacts;

forming a first mask over the dielectric layer, such first mask having a window therein disposed over a portion of the dielectric layer to expose an underlying portion of the dielectric layer, such exposed portion of the dielectric layer being disposed over a portion of the gate metal contact;

applying a dry etch to the first mask to remove portions of the dielectric layer exposed by the window to expose the portion of the gate metal contact, remaining portions of the dielectric being left over an edge region of the gate metal contact;

removing the first mask;

forming a second mask over the remaining portions of the dielectric layer, such second mask having a window therein disposed over portions of the gate metal contact and over the portions of the dielectric left over the edge region of the gate metal contact;

forming a field plate metal through the window in the second mask, such field plate: being electrically connected to the exposed portion of the gate metal contact; being separated the edge region of the gate metal contact by the portions of the dielectric left over the edge region; and, extending beyond the edge of the gate metal contact towards the drain metal contact.

\* \* \* \* \*

UNITED STATES PATENT AND TRADEMARK OFFICE
CERTIFICATE OF CORRECTION

| | | |
|---|---|---|
| PATENT NO. | : 7,498,223 B2 | Page 1 of 1 |
| APPLICATION NO. | : 11/693762 | |
| DATED | : March 3, 2009 | |
| INVENTOR(S) | : Kiuchul Hwang et al. | |

It is certified that error appears in the above-identified patent and that said Letters Patent is hereby corrected as shown below:

On the Title Page, Item 57

Abstract, line 2, delete "contact a" and replace with -- contact with a --.

Abstract, line 6, delete "contact the" and replace with -- contact with the --.

Abstract, line 13, delete "field-plate" and replace with -- field plate --.

In the Specification

Col. 1, line 42, delete ", field plate" and replace with -- , the field plate --.

Col. 1, line 56, delete "gate-filed" and replace with -- gate-field --.

Col. 1, line 56, delete "is in contact" and replace with -- in contact --.

Col. 1, line 58, delete "with gate" and replace with -- with a gate --.

Col. 1, line 66, delete "contact a" and replace with -- contact with a --.

Col. 2, line 2, delete "contact the" and replace with -- contact with the --.

Col. 2, line 32, delete "separated the" and replace with -- separated from the --.

Col. 2, line 64, delete "here lower" and replace with -- here a lower --.

Col. 3, line 4, delete "contacts" and replace with -- contact --.

Col. 3, line 17, delete "portions" and replace with -- portion --.

Col. 3, line 22, delete "over edge regions 32" and replace with -- over the edge region 32 --.

Col. 3, line 40, delete "separated the" and replace with -- separated from the --.

In the Claims

Col. 4, line 48, delete "separated the" and replace with -- separated from the --.

Signed and Sealed this
Eighteenth Day of February, 2014

Michelle K. Lee
*Deputy Director of the United States Patent and Trademark Office*